(12) United States Patent
Schaffroth et al.

(10) Patent No.: US 6,313,656 B1
(45) Date of Patent: Nov. 6, 2001

(54) METHOD OF TESTING LEAKAGE CURRENT AT A CONTACT-MAKING POINT IN AN INTEGRATED CIRCUIT BY DETERMINING A POTENTIAL AT THE CONTACT-MAKING POINT

(75) Inventors: Thilo Schaffroth, Röhrmoos; Florian Schamberger, Bad Reichenhall; Helmut Schneider, München, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/372,307

(22) Filed: Aug. 11, 1999

(30) Foreign Application Priority Data

Aug. 11, 1998 (DE) ................................. 198 36 361

(51) Int. Cl.[7] ........................ G01R 31/02; G01R 31/26; H01H 31/02
(52) U.S. Cl. ........................... 324/763; 324/765; 324/537
(58) Field of Search ................. 324/537, 73.1, 324/763, 765, 158.1, 758, 713; 714/733, 734, 25

(56) References Cited

U.S. PATENT DOCUMENTS

| | | | |
|---|---|---|---|
| 4,862,070 | | 8/1989 | Ostertag ........................... 324/73.1 |
| 5,325,068 | * | 6/1994 | Rauf ................................. 324/713 |
| 5,338,978 | * | 8/1994 | Larsen et al. ..................... 326/21 |
| 5,371,457 | * | 12/1994 | Lipp .................................. 324/158.1 |
| 5,428,297 | * | 6/1995 | Grace et al. ..................... 324/758 |
| 5,594,359 | * | 1/1997 | Hashimoto ....................... 324/765 |
| 5,773,990 | * | 6/1998 | Wilstrup et al. ................. 324/765 |
| 5,789,933 | * | 8/1998 | Bown et al. ...................... 324/765 |
| 5,826,004 | * | 10/1998 | Bae .................................. 714/25 |
| 5,917,331 | * | 6/1999 | Persons ............................ 324/765 |
| 5,939,894 | * | 8/1999 | Yamauhi et al. ................. 324/765 |
| 6,005,433 | * | 12/1999 | Hale ................................. 327/379 |
| 6,008,664 | * | 12/1999 | Jett et al. .......................... 324/765 |
| 6,011,403 | * | 1/2000 | Gillette ............................. 324/763 |
| 6,028,439 | * | 2/2000 | Arkin et al. ...................... 324/765 |
| 6,031,386 | * | 2/2000 | Cole, Jr. et al. .................. 324/765 |
| 6,035,421 | * | 3/2000 | Henno et al. ..................... 714/30 |
| 6,043,672 | * | 3/2000 | Sugasawara ...................... 324/765 |

FOREIGN PATENT DOCUMENTS

3836813A1    5/1989  (DE) .

* cited by examiner

Primary Examiner—Glenn W. Brown
Assistant Examiner—Wasseem H. Hamdan
(74) Attorney, Agent, or Firm—Herbert L. Lerner; Laurence A. Greenberg; Werner H. Stemer

(57) ABSTRACT

A method of testing leakage current at a contact-making point in an integrated circuit includes applying a test potential to the contact-making point through an output of an application device. The output of the application device is connected to a high impedance or is isolated from the contact-making point. The potential at the contact-making point is determined as a measure of the leakage current being produced.

8 Claims, 3 Drawing Sheets

METHOD OF TESTING LEAKAGE CURRENT AT A CONTACT-MAKING POINT IN AN INTEGRATED CIRCUIT BY DETERMINING A POTENTIAL AT THE CONTACT-MAKING POINT

BACKGROUND OF THE INVENTION

Field of the Invention

The invention relates to a method of testing the leakage current at a contact-making point in an integrated circuit. The term "leakage current" is understood herein as meaning a current which flows between the contact-making point and supply potentials of the integrated circuit, when a potential is applied to the contact-making point.

One method of testing the leakage current at a contact-making point includes connecting the contact-making point to a constant voltage source and measuring the resultant leakage current directly. That requires an appropriate current measuring device.

Summary of the Invention

It is accordingly an object of the invention to provide a method of testing the leakage current at a contact-making point in an integrated circuit, which overcomes the hereinafore-mentioned disadvantages of the heretofore-known methods of this general type and which can be carried out without a current measuring device and with little outlay for hardware.

With the foregoing and other objects in view there is provided, in accordance with the invention, a method of testing leakage current at a contact-making point in an integrated circuit, which comprises applying a test potential to the contact-making point through an output of an application device; connecting the output of the application device to a high impedance or isolating the output of the application device from the contact-making point; and determining a potential at the contact-making point as a measure of the leakage current produced.

Accordingly, with the invention, there is no direct measurement of the leakage current at the contact-making point. Therefore, no current measuring device is required for measuring the leakage current. Instead, the invention involves investigating how the potential at the contact-making point behaves after the test potential has been applied. The potential difference between the test potential and the determined potential is a measure of the electric charge flowing from the contact-making point and thus of the leakage current at the contact-making point. Since the output of the application device is connected to a high impedance, no charge can flow from the contact-making point to the application device or in the opposite direction during the predetermined time interval. Therefore, it is not possible for the application device to influence the leakage current.

In accordance with another mode of the invention, the method of testing the leakage current is initially carried out using a test potential at a first potential level and subsequently using a test potential at a second potential level. This affords the advantage of determining the various resultant leakage currents for various potential states of the contact-making point. This enables the respective circuit leakage current flowing from the contact-making point to the respectively opposite supply potential to be determined, particularly if the two potential levels are supply potential levels in the integrated circuit.

In accordance with a further mode of the invention, the potential at the contact-making point is determined and checked after a predetermined time interval to determine whether the potential determined has exceeded or fallen below a limit value. This predetermines a maximum permissible leakage current by predetermining a time interval and a limit value. In contrast to direct measurement of the potential, this embodiment has the advantage of permitting relatively simple technical measures to be used to monitor the limit value.

In accordance with an added mode of the invention, the method involves determining the time interval after which the potential at the contact-making point exceeds or falls below a limit value after the contact-making point has been subjected to the test potential. This requires a timer device which determines the time interval. In this case, the leakage current produced can be calculated as the product of the charge difference between the test potential and the determined potential at the contact-making point and the measured time interval.

In accordance with an additional mode of the invention, the potential at the contact-making point is determined by a determination unit which is a component of the integrated circuit. This has the advantage that no external circuit unit is required to determine the potential.

In accordance with yet another mode of the invention, the potential at the contact-making point is determined particularly simply by using an input circuit in the integrated circuit as a determination unit with a switching threshold. This input circuit is used to determine whether the potential at the contact-making point is above or below its switching threshold. This has the advantage of determining the potential by using a very simple component which can be used to supply external signals during normal operation of the circuit.

In accordance with yet a further mode of the invention, the test method is carried out by using an application device which is a component of the integrated circuit. No external application device is then required for applying the test potential to the contact-making point, so that the leakage current can be tested as part of a self-test in the integrated circuit.

In accordance with a concomitant mode of the invention, the time interval after which the potential at the contact-making point is determined or after which the potential has fallen below or exceeded the limit value is determined through the use of a timer device which is a component of the integrated circuit. This means that there is no need to supply the integrated circuit with a corresponding external time signal or to provide a further external connection that is necessary for this purpose.

Other features which are considered as characteristic for the invention are set forth in the appended claims.

Although the invention is illustrated and described herein as embodied in a method of testing the leakage current at a contact-making point in an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
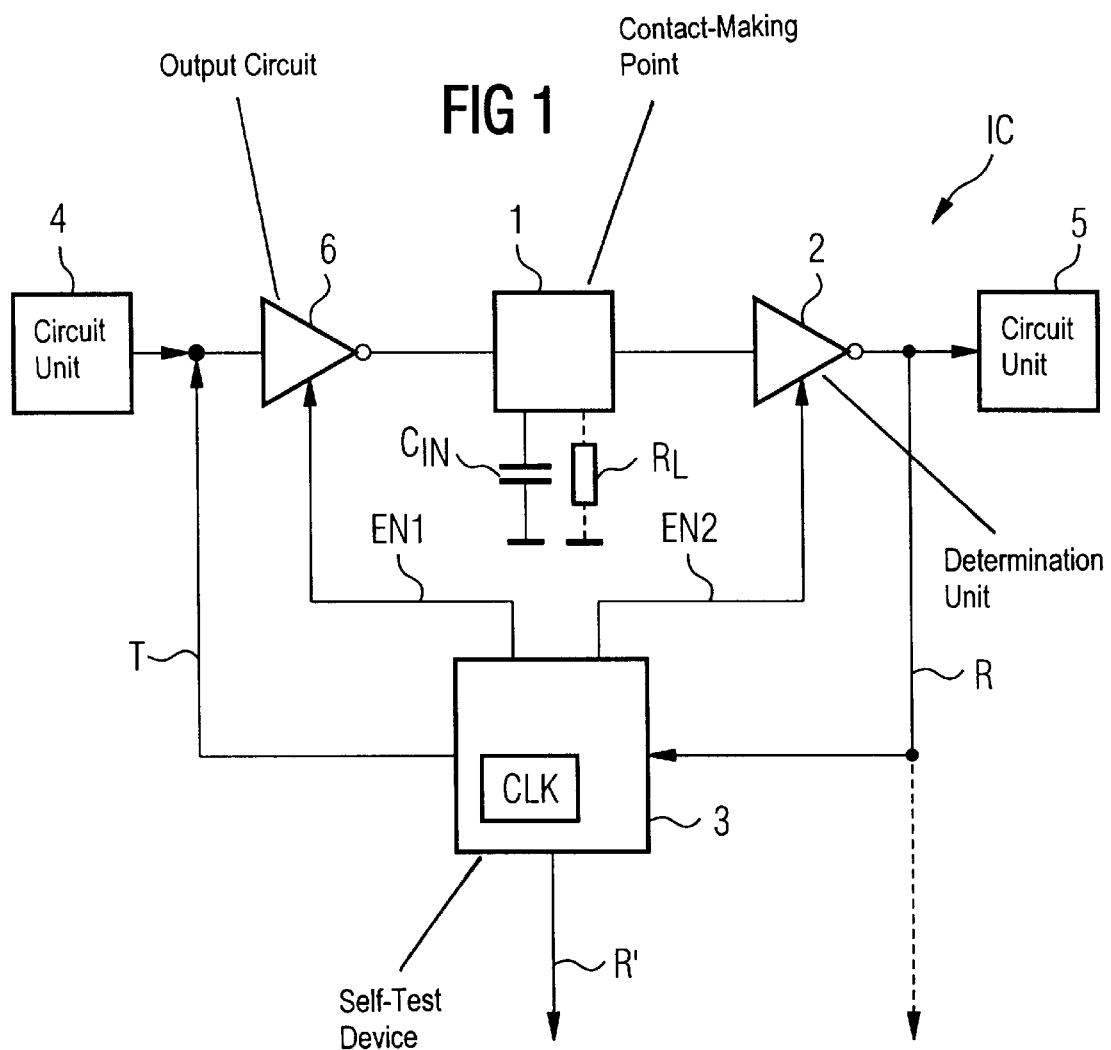
FIG. 1 is a schematic and block-circuit diagram of a first illustrative embodiment of the method according to the invention.

Referring now to the figures of the drawings in detail and first, particularly, to FIG. 1 thereof, there is seen an integrated circuit IC which is suitable for carrying out the inventive method of testing leakage current. The circuit has a contact-making point 1 for making external contact with the integrated circuit IC. The contact-making point 1 is connected through an input circuit or determination unit 2, in the form of an inverter, to a circuit unit 5. In a normal mode of operation, external signals can be transmitted to the circuit module 5 through the contact-making point 1 and the input circuit 2. The integrated circuit IC has a further circuit module 4 which is connected through an output circuit 6 (likewise in the form of an inverter) to the contact-making point 1. In the normal mode of operation of the integrated circuit, signals can be transmitted from the further circuit unit 4 through the output circuit 6 to the contact-making point 1 and from there to the exterior of the integrated circuit IC. The integrated circuit IC additionally has a self-test device 3 which carries out the leakage current test at the contact-making point 1. The self-test device 3 controls the output circuit 6 using a first activation signal EN1 and controls the input circuit 2 using a second activation signal EN2. The self-test device 3 has a timer device CLK which is used to control the timing of the signals needed for testing the leakage current.

Furthermore, an output of the self-test device 3 is connected to an input of the output circuit 6. The self-test device 3 and the output circuit 6 form an application device for applying a test potential T to the contact-making point 1. An input of the self-test device 3 is connected to an output of the input circuit 2.

In this case, the leakage current at the contact-making point 1 is dependent on an input capacitance $C_{IN}$ of the input circuit 2 and on a parasitic leakage current resistance $R_L$, both of which are shown in FIG. 1 for illustrative purposes.

Figure 3:
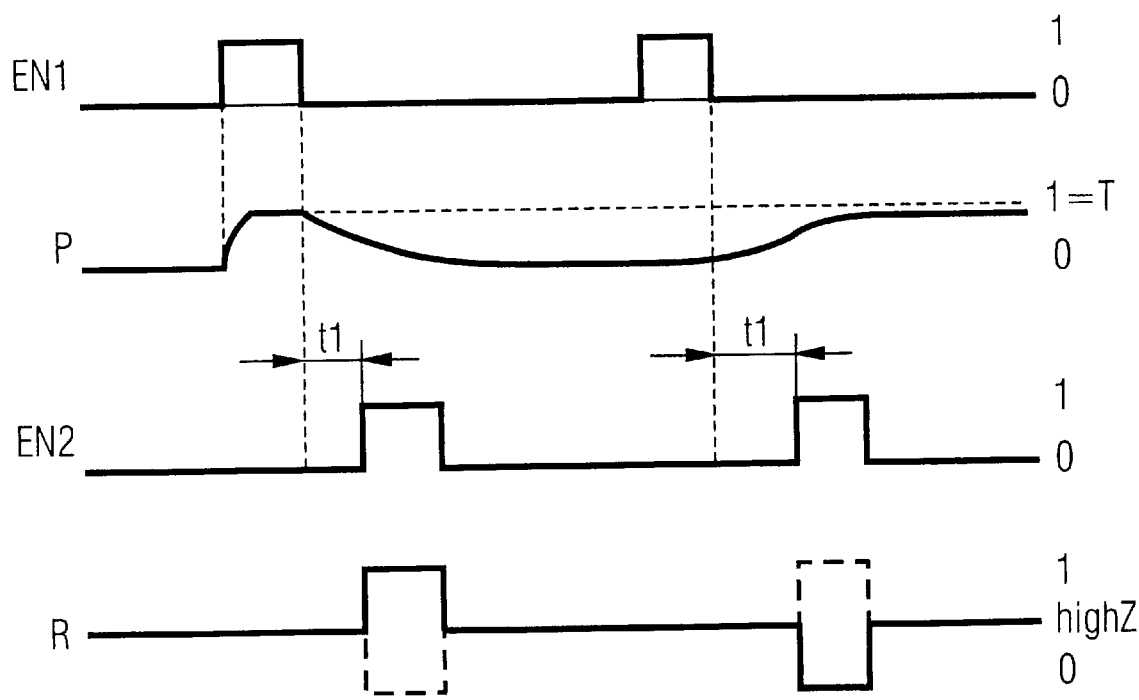
FIGS. 3 and 4 are graphs showing signal waveforms for the illustrative embodiment shown in FIG. 1.

FIG. 3 shows waveforms of some of the signals from FIG. 1. FIG. 3 will be used below to explain the method of testing the leakage current. The input circuit 2 and the output circuit 6 are each deactivated when the corresponding activation signals EN2, EN1 are at a low level and activated when the activation signals are at a high level. In the deactivated state, the outputs of the output circuit 6 and of the input circuit 2 are each connected to a high impedance. The leakage current is tested in a test mode of the integrated circuit IC. The integrated circuit IC can be switched to the test mode by applying appropriate external signals. FIG. 3 shows, from top to bottom, the first activation signal EN1 for the output circuit 6, a potential P at the contact-making point 1, the second activation signal EN2 for the input circuit 2 and an output signal from the input circuit 2 in the form of a result signal R for the leakage current test.

At the start of the leakage current check, the outputs of both the output circuit 6 and the input circuit 2 are connected to a high impedance. A high level of the first activation signal EN1 is then firstly used by the self-test device 3 to activate the output circuit 6, so that a test potential T at a high level is transmitted from the self-test device 3 to the contact-making point 1 through the output circuit 6. The potential P at the contact-making point 1 then rises to the high level of the test potential T. The output circuit 6 is then deactivated by the first activation signal EN1 assuming a low level. The output of the output circuit 6 is thus connected to a high impedance. During a predetermined time interval t1 determined through the use of the timer device CLK in the self-test device 31 the input circuit 2 is furthermore deactivated by a low level of the second activation signal EN2. The potential P at the contact-making point 1 actually begins to fall at the start of the predetermined time interval t1, due to the leakage current being produced. At the end of the predetermined time interval t1, the second activation signal EN2 changes to a high level, which activates the input circuit 2. The input circuit 2 then outputs the result signal R. The result signal R is at a high level if the potential P at the contact-making point 1 has already fallen below a switching threshold of the input circuit 2. The result signal R is at a low level if the potential P at the contact-making point 1 has not yet fallen below the switching threshold.

The potential of the result signal R after the end of the predetermined time interval t1 is therefore a measure of the amount by which the potential P at the contact-making point 1 has dropped during the predetermined time interval t1. The result signal thus also reveals whether or not the leakage current at the contact-making point 1 is in excess of a certain limit value during the predetermined time interval t1. This limit value is dependent on the duration of the time interval t1.

In the illustrative embodiment shown in FIG. 1, the result signal R is transmitted from the input circuit 2 to the self-test circuit 3, which transmits a corresponding external result signal R' to the exterior of the integrated circuit IC. As an alternative to the illustrative embodiment in FIG. 1, the input circuit 2 can also directly transmit the result signal R to the exterior of the integrated circuit IC (shown in FIG. 1 by a dashed arrow).

The right-hand part of FIG. 3 shows a second phase of the leakage current test, in which the contact-making point 1 has the test potential T applied to it before the time interval t1 starts. The test potential T is at a low level ("0", ground) instead of at a high level ("1", VCC), as previously. During the time interval t1, the leakage current being produced causes the potential P at the contact-making point to rise to a value between the high and the low level. After the end of the time interval t1, activation of the input circuit 2 through the use of the second activation signal EN2 again causes the input circuit 2 to generate the result signal R, which is at a different level depending on whether the potential P at the contact-making point 1 is above or below the switching threshold of the input circuit 2 at that instant.

Checking the leakage current using two different test potentials T as described completes the leakage current test.

The two time intervals t1 shown in FIG. 3 and predetermined for the leakage current test when a test potential T at a high level or at a low level is applied, can either be selected to be of the same length or can have different durations.

Figure 2:
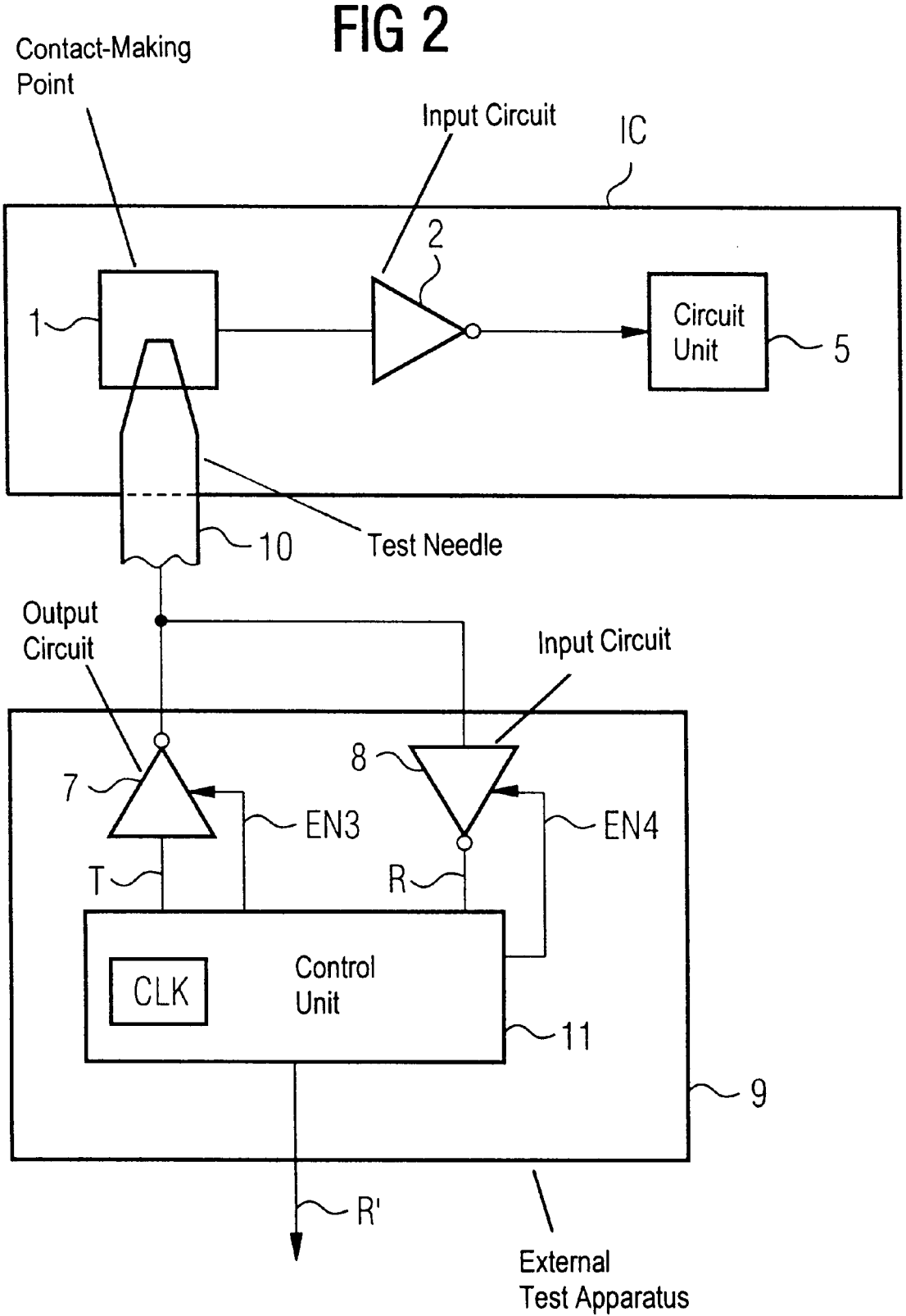
FIG. 2 is a block-circuit diagram of a second illustrative embodiment of the invention.

FIG. 2 shows a second illustrative embodiment of the leakage current test, which is carried out by using an external test apparatus 9. The same components as in FIG. 1 have the same reference symbols. The external test apparatus 9 has a control unit 11, with a component that is a timer device CLK. The control unit 11 is connected to the contact-making point through an output circuit 7 and a test needle 10. In FIG. 2, the application device for applying the test potential T to the contact-making point 1 is formed by the control unit 11 and the output circuit 7 of the external test apparatus 9.

The contact-making point 1 is also connected through the test needle 10 and an input circuit 8 to an input of the control unit 11. The output circuit 7 and the input circuit 8 of the external test apparatus 9 are activated and deactivated by the control unit 11 through the use of a third activation signal EN3 and a fourth activation signal EN4. The leakage current is checked at the contact-making point 1, according to FIG. 2, in a manner similar to that of FIG. 1. The only difference is that the test potential T is supplied externally through the output circuit 7 and the result signal R is generated as an output signal from the input circuit 8 of the test apparatus 9 outside the integrated circuit IC. FIG. 3 also shows the waveform of the leakage current test for the illustrative embodiment of FIG. 2 if, in FIG. 3, the first activation signal EN1 is replaced by the third activation signal EN3 and the second activation signal EN2 is replaced by the fourth activation signal EN4.

In the illustrative embodiment shown in FIG. 2, instead of connecting the output circuit 7 of the test apparatus 9 to a high impedance during the time interval t, the test needle 10 can also be removed from the contact-making point 1, so that the output circuit 7 is electrically isolated from the contact-making point 1.

The illustrative embodiments explained with reference to FIG. 1 and FIG. 2 are distinguished by particularly little outlay for hardware. In addition, the example of FIG. 1 has the advantage of permitting the leakage current to be tested as part of a self-test in the integrated circuit IC without the need for an external test apparatus as in the illustrative embodiment of FIG. 2.

In other illustrative embodiments of the invention, a voltage measuring device, which detects the potential directly and not just considered in relation to a limit value, can also be used to determine the potential P at the contact-making point. 1 after the end of the predetermined time interval t1. That is done instead of using the digital input circuit 2 or 8 (which registers only that a limit value has been exceeded or has been undershot). Although the complexity therefor is considerably higher, this is made up for by the fact that the leakage current can be calculated exactly during the predetermined time interval t1 from the charge that has flowed away.

In contrast to FIG. 1, the timing of the leakage current test can also be controlled through the use of an externally supplied time signal instead of by the timer device CLK. An additional external connection of the integrated circuit IC is then required for the time signal.

Figure 4:
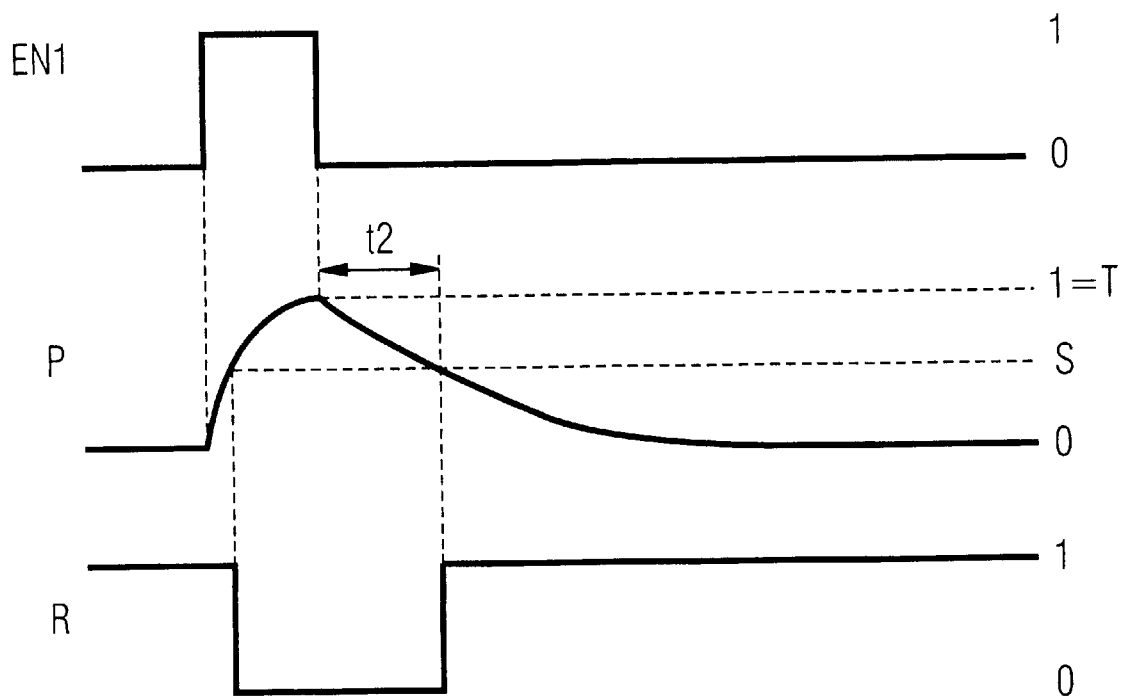

FIG. 4 shows an alternative signal waveform to that shown in FIG. 3 for the illustrative embodiment shown in FIG. 1. In this case, the second activation signal EN2 is constantly at a high level during the leakage current test, so that the input circuit 2 is constantly activated. In this case, the timer unit CLK is not used to determine whether the potential P at the contact-making point has already exceeded or fallen below a limit value after a predetermined time interval. Instead, the timer unit CLK is used to determine a time interval t2 elapsing before the switching threshold of the input circuit 2 is exceeded or undershot (with only the latter case being shown in FIG. 4). The output circuit 6 is activated as a function of the first activation signal EN1, so that the contact-making point 1 has the test potential T applied thereto, with the test potential T being at a high level in the case shown. While the potential P at the contact-making point rises to the high level while the test potential is applied, it exceeds the switching threshold of the input circuit 2, which means that the result signal R at its output changes from the high to the low level. A negative edge of the first activation signal EN1 deactivates the output circuit 6, so that the contact-making point 1 floats and its potential P falls slowly due to the leakage current being produced. As soon as the potential P falls below the switching threshold of the input circuit 2, the result signal R changes to the high level again. The time interval t2 between the end of the test potential being applied (negative edge of the first activation signal EN1) and the positive edge of the result signal R, is detected either outside the integrated circuit, or else preferably by using the timer unit CLK in the self-test device 3. This time interval t2 is used together with the (known) switching threshold of the input circuit 2 to determine the leakage current produced per unit time.

We claim:

1. In a method of testing leakage current at a contact-making point in an integrated circuit, the improvement which comprises:

providing an integrated circuit having a contact-making point and a determination unit;

providing an application device with an output supplying a test potential;

using the output of the application device to apply the test potential to the contact-making point;

after the test potential has been applied to the contact-making point, connecting the output of the application device to a high impedance or isolating the output of the application device from the contact-making point to avoid influence on the leakage current by the application device; and with the determination unit, determining a potential at the contact-making point as a measure of the leakage current produced.

2. The method according to claim 1, which comprises carrying out the step of determining the potential at the contact-making point after a predetermined time interval, and checking to determine whether the potential determined has exceeded or fallen below a limit value.

3. The method according to claim 2, which comprises determining the predetermined time interval with a timer device being a component of the integrated circuit.

4. The method according to claim 1, which comprises determining a time interval after which the potential at the contact-making point exceeds or falls below a limit value, after the contact-making point has been subjected to the test potential.

5. The method according to claim 4, which comprises determining the time interval with a timer device being a component of the integrated circuit.

6. The method according to claim 1, wherein the determination unit is a digital input circuit in the integrated circuit with a switching threshold, and the input circuit determines whether the potential at the contact-making point is above or below its switching threshold.

7. The method according to claim 1, which comprises carrying out the step of applying the test potential to the contact-making point, with an application device being a component of the integrated circuit.

8. The method according to claim 1, which comprises carrying out the step of applying the test potential to the contact-making point initially by using a test potential at a first potential level and subsequently by using a test potential at a second potential level.

* * * * *